United States Patent
Zhuge

(10) Patent No.: US 11,754,724 B2
(45) Date of Patent: Sep. 12, 2023

(54) CROSS SPECTRUM ANALYSIS FOR TIME STAMPED SIGNALS

(71) Applicant: Crystal Instruments Corporation, Santa Clara, CA (US)

(72) Inventor: James Q. Zhuge, Palo Ato, CA (US)

(73) Assignee: Crystal Instruments Corporation, Santa Clara, CA (US)

(*) Notice: Subject to any disclaimer, the term of this patent is extended or adjusted under 35 U.S.C. 154(b) by 64 days.

(21) Appl. No.: 17/564,654

(22) Filed: Dec. 29, 2021

(65) Prior Publication Data

US 2023/0204791 A1    Jun. 29, 2023

(51) Int. Cl.
*G01D 3/02* (2006.01)
*G01D 18/00* (2006.01)
(Continued)

(52) U.S. Cl.
CPC ............... *G01S 19/23* (2013.01); *G01D 3/02* (2013.01); *G01D 18/00* (2013.01); *G01S 19/25* (2013.01)

(58) Field of Classification Search
CPC ........... G01S 19/23; G01S 19/25; G01D 3/02; G01D 18/00
(Continued)

(56) References Cited

U.S. PATENT DOCUMENTS 5,563,607 A   10/1996   Loomis et al.
6,104,729 A   8/2000    Hellum et al.
(Continued)

FOREIGN PATENT DOCUMENTS

CN   100498232 C   6/2009
CN   102546071 A   7/2012
(Continued)

OTHER PUBLICATIONS

Crystal Instruments, "CoCo-80X/90X" User Manual, Dynamic Signal Analyzer Mode, Jul. 23, 2018, 59 pages.
(Continued)

*Primary Examiner* — Harry K Liu
(74) *Attorney, Agent, or Firm* — Mark Protsik; Thomas Schneck

(57) ABSTRACT

For cross-channel spectral analysis of measurement data from multiple recording units with independent sampling clocks, a processing method corrects phase mismatch between the data received over the different channels. Blocks of sampled measurement data are buffered in a hardware logic circuit and timestamps are associated with successive blocks through a hardware interrupt to a GPS receiver of each recording unit. For each first channel data block, the block's starting point, a closest point in time in a data block of the second channel, and the starting point of that second channel data block are determined, using GPS timestamps associated with those data blocks, nominal sampling rate and block size. Phase correction based on the time offset between starting points of the pairs of data blocks and the interval between starting points of successive blocks is applied in the frequency domain after a time-to-frequency domain transformation. Multiple frames of phase-corrected spectra may then be averaged. Only a subset of samples in each data block need be used based upon a specified overlap ratio.

18 Claims, 10 Drawing Sheets

(51) Int. Cl.
*G01S 19/23* (2010.01)
*G01S 19/25* (2010.01)

(58) Field of Classification Search
USPC .................................................. 342/357.62
See application file for complete search history.

(56) References Cited

U.S. PATENT DOCUMENTS

| | | | |
|---|---|---|---|
| 6,735,339 | B1 | 5/2004 | Barford et al. |
| 7,656,985 | B1 | 2/2010 | Aweya et al. |
| 7,720,644 | B2 | 5/2010 | Barford |
| 7,729,889 | B2 | 6/2010 | Barford |
| 7,756,712 | B2 | 7/2010 | Huang |
| 7,795,858 | B2 | 9/2010 | Tufillaro et al. |
| 8,416,812 | B2 | 4/2013 | Radulescu |
| 8,477,812 | B2 | 7/2013 | Gurdan et al. |
| 8,688,874 | B2 | 4/2014 | Foster |
| 8,819,472 | B1 | 8/2014 | Muscha et al. |
| 8,922,421 | B2 | 12/2014 | Pomietlasz |
| 9,002,672 | B2 | 4/2015 | Reindeau et al. |
| 9,014,021 | B2 | 4/2015 | Ponnuswamy |
| 9,111,042 | B1 | 8/2015 | Mendel |
| 9,541,949 | B2 | 1/2017 | Kuzi et al. |
| 9,655,074 | B2 | 5/2017 | Di Cera Colazingari et al. |
| 10,135,660 | B1 * | 11/2018 | Zhu .................... H04L 25/03057 |
| 10,257,798 | B1 | 4/2019 | Koelemeij et al. |
| 10,483,997 | B1 | 11/2019 | Ganesan et al. |
| 10,541,900 | B2 | 1/2020 | Sadana et al. |
| 11,652,489 | B1 * | 5/2023 | Fortier .................... H03L 7/085 327/156 |
| 2019/0182091 | A1 | 6/2019 | Bai et al. |
| 2019/0379475 | A1 | 12/2019 | Seethamraju |
| 2020/0145314 | A1 | 5/2020 | Sadana et al. |
| 2021/0041908 | A1 | 2/2021 | Sanghi et al. |
| 2021/0075584 | A1 | 3/2021 | Babich |
| 2021/0313993 | A1 | 10/2021 | Bai et al. |

FOREIGN PATENT DOCUMENTS

| | | | | |
|---|---|---|---|---|
| CN | 101388741 B | | 12/2012 | |
| CN | 105429725 A | | 3/2016 | |
| CN | 110649910 B | * | 2/2023 | ............. H03H 17/02 |
| WO | WO-2021076518 A1 | * | 4/2021 | ............. G01S 19/30 |

OTHER PUBLICATIONS

Crystal Instruments, "CoCo-80X Dynamic Signal Analyzer" brochure, May 2019, www.crystalinstruments.com, 20 pages.
Crystal Instruments, "Spider DSA", User Manual, Feb. 15, 2019, www.crystalinstruments.com, 47 pages.
Crystal Instruments, "Spider-100", brochure, Integrated controller for temperature humidity and vibration control, Jun. 2016, www.crystalinstruments.com, 20 pages.
Crystal Instruments, "Dynamic signal analysis basics", CI product note No. 001, Dec. 2015, www.crystalinstruments.com, 18 pages.
U-Blox, "LEA-6 Data Sheet", 2017, UBX-14044797, www.u-blox.com, 26 pages.
Crystal Instruments, "Remote condition monitoring" CI product note No. 035, 2018, www.crystalinstruments.com, 6 pages.
Joe Begin, TechNote 138, "Transfer function measurements with APx500 Audio Analyzers", Audio Precision, application and technical support for users, www.ap.com, Feb. 19, 2019, 10 pages.
CN100498232c, English translation, 10 pages.
CN101388741B, English translation, 11 pages.
CN102546071A, English translation, 16 pages.
CN105429725A, English translation, 16 pages.

* cited by examiner

CROSS SPECTRUM ANALYSIS FOR TIME STAMPED SIGNALS

TECHNICAL FIELD

The present invention relates to digital data processing equipment and methods specially adapted for time and frequency domain transformations and correlation function computations to evaluate the measurements obtained from data acquisition units. The invention relates more particularly to cross-spectrum analysis of timestamped measurements obtained from multiple data acquisition units, each with their own independent analog-to-digital converter (ADC) sampling clocks.

BACKGROUND ART

Recently, a new ground recording system was developed that can accurately time stamp the acquired digital data using satellite radio beacon positioning (such as GPS) and field programmable gate array (FPGA) hardware technologies. The accuracy of time stamps is better than 10 µs and can be as accurate as 100 ns. After the time stamps are applied to the acquired data and a first-order correction is calculated, the measurements acquired from different data acquisition units can be accurately aligned in a time display.

Now that we have timestamped data, the next question is how to compute the classic spectra that are available in a dynamic signal analyzer when such measurements have been obtained from different recording units over two or more independent data channels. In most typical Fast Fourier Transform (FFT) analyzers, the following spectra are always computed: auto power spectra of all measurement channels; cross-spectra of any pair of channels; transfer function (the Frequency Response Function or FRF) of any pair of channels; coherence functions of any pair of channels; and phase spectra of any pair of channels. Once the auto power spectra and cross-spectrum of a pair of channels are computed, the other functions can be derived. The auto-power spectra computation is very simple and straightforward. They can be derived from the Fourier Transform spectrum of the time block data. However, the cross-spectrum computation is complicated by the fact that, though accurately time stamped, the data from any pair of channels have been measured using independent sampling clocks in the different units, with a resultant phase mismatch between the two channels. Unless properly adjusted, the cross-spectrum results will be incorrect.

If the phase mismatch between pairs of data channels can be corrected, there would be many potential applications for the technology. Essentially, any structure or acoustic measurement that requires multiple sensors distributed in a wide range could then take advantage of such a system, as the cross-channel terms would be calculated with greater accuracy. For example, measurement of aircraft sonic booms (or other environmental noise) requires hundreds of ground recording units spread across tens of thousands of square miles taking simultaneous timestamped measurements. For measuring vibration modes of a large bridge, with only two data acquisition units and by roving the measurement points, it is possible to measure the operating deflecting shape of the bridge. All we need are a sequence of pairs of FRF measurement. Likewise, a ground recording system is ideal to measure the vibration modes of ships, aircraft, large trucks, bullet trains, railways, large cranes, and other large structures.

Traditionally, the measurement for a large structure is conducted by using a high channel count data acquisition system with very long sensor cables. Alternatively, a distributed system with wired synchronization cable can be used. In both cases the idea is to synchronize the sampling clocks of Analog-to-Digital Converters (ADC) of each sensor channel so that cross spectrum computation will not have phase distortion. It is usually very expensive to build such large measurement system across very long range. In fact, either the cable length of the sensor or for ADC sync cannot be longer than 300 meters. In addition, the electrical noise will also reduce the measurement accuracy using traditional methods.

SUMMARY DISCLOSURE

In the present invention, the phase mismatch between any pair of FFT spectra can be corrected based on certain calculations of time stamps. Data acquisition units sample measurement data and, using received GPS signals, apply associated time stamps to the acquired data. Combining established measurement parameters of the data acquisition units, such as nominal sampling rate, block size and overlap ratio, with the associated time stamps of the measurement data, the relative starting points of two channels from different data acquisition units can be determined. Using this information, a phase adjustment can be made when the cross spectrum is calculated.

With the present invention, a complex large data acquisition system can be replaced with two or more smaller systems that are distributed at any distance while all classic spectrum quantities available in a dynamic signal analyzer can still be computed.

A test indicates that the system can achieve this phase estimation accuracy in the cross-spectral calculation:

| Phase match between two data acquisition units: | ±5° (degree) at 40 kHz ±2.5° (degree) at 20 kHz, ±0.5° (degree) at 2 kHz. |
|---|---|

While others have used a GPS time base for data acquisition, such outstanding cross-spectral calculation results have not been achieved until now.

The only limitation of this technology is that the data acquisition units need to receive GPS signals. Without GPS signals, the time stamps won't be available.

DETAILED DESCRIPTION

Ground Recording System Overview

Figure 1:
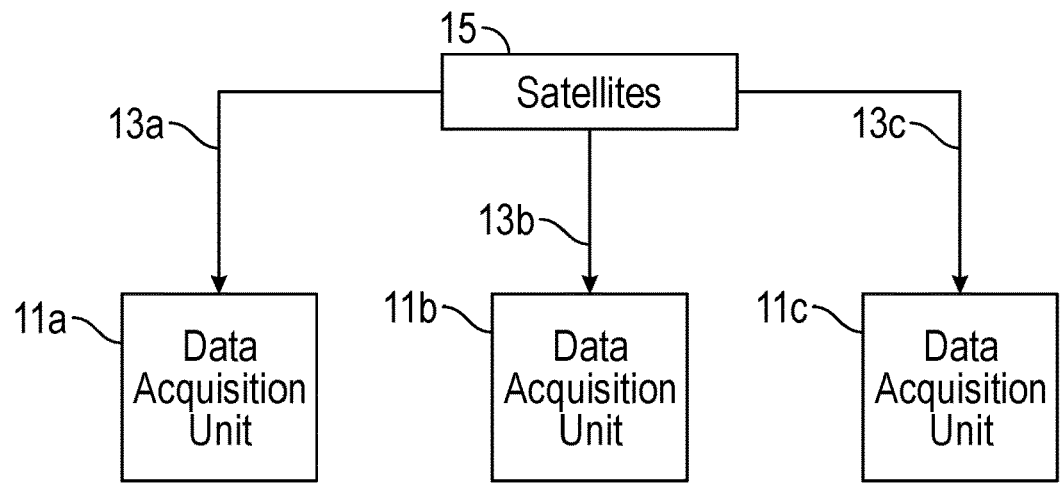
FIG. 1 is a schematic overview of a ground recording system with multiple data acquisition units receiving satellite beacon signals for GPS timestamping.

With reference to FIG. 1, a distributed data acquisition system has a set of recording units 11a-11c (often fixed ground units, but mobile units including some onboard aircraft flying above ground at various altitudes are also possible) to provide analog-to-digital sampling of measurement data by each of those units 11a-11c. These data acquisition units 11a-11c also receive streams of broadcast radio messages 13a-13c from a constellation of orbiting satellites 15 that together form a satellite radio beacon positioning system, such the United States' Global Positioning System (GPS), the Russian Federation's Global Navigation Satellite System (GLONASS), the European Union's GALILEO system, or any of the regional satellite navigation systems provided by India, China, or Japan. The stream of received satellite radio messages 13a-13c contain satellite position and absolute time information useful not only for determining a data acquisition unit's current position on (or above) the Earth's surface, but also for time stamping and synchronization of the data collection. The data acquisition units 11a-11c may also receive wireless radio command signals from a remote host, not shown.

As seen in FIG. 1, multiple data acquisition systems or remote ground sensing and recording units can be widely distributed over hundreds of square kilometers. One example of such a distributed system is a ground recording system (GRS) for acoustic sensing of aircraft noise. Inmost cases, even the closest pair of such units are physically separated from each other hundreds of meters or more from each other. There is no electrical hardware connection between any of them, each unit collecting data essentially independently of the others, except that they will all receive the GPS signals from the satellites and certain commands from a remote computer through wireless communication methods.

It is necessary for analysis to be able to synchronize the data sampling of the multiple units. Such systems typically employ the transmitted timestamp messages received from satellite radio beacon positioning systems (e.g., GPS, GLONASS, GALILEO) as a basis for the time measurement determinations. Each of the remote sensor units receives certain commands from a remote computer via wireless communication, and along with the GPS (or related) satellite signals, it uses those GPS signals to synchronize the sampling clocks of the analog-to-digital converters (ADCs) in the sensor unit. Accuracy in the time measurement is extremely important for precise time stamping of the sampled data. For some remote monitoring systems, a one millisecond accuracy may be adequate. However, in some acoustic-sensing ground recording systems, the various remote sensors may need to be operated so that all live data records are timestamped to 10 µs accuracy or better. Other remote condition monitoring applications could have similar, or possibly even more stringent, accuracy requirements.

To meet that timestamping accuracy requirement, a system and method is provided to timestamp measurement data collected by a distributed data acquisition system with multiple, physically unconnected, data acquisition units that can be in wireless communication with a central host. A series of messages broadcast from a satellite radio beacon positioning system (such as GPS) are received by each of the data acquisition units, which continuously derives from the received messages at least a current absolute time. (The current position of each unit may also be derived from the messages, especially in the case of mobile units.)

The data acquisition units have a specific manner of using the received satellite messages 13a-13c by the data acquisition units 11a-11c to timestamp the sampled measurement data, as discussed below in reference to FIG. 2. These units provide a timestamp accuracy of 10 µs to 100 ns relative to the same absolute timeframe (such as Coordinated Universal Time or UTC) for data synchronization among the widely distributed data acquisition units 11a-11c.

Data Acquisition Units

Figure 2:
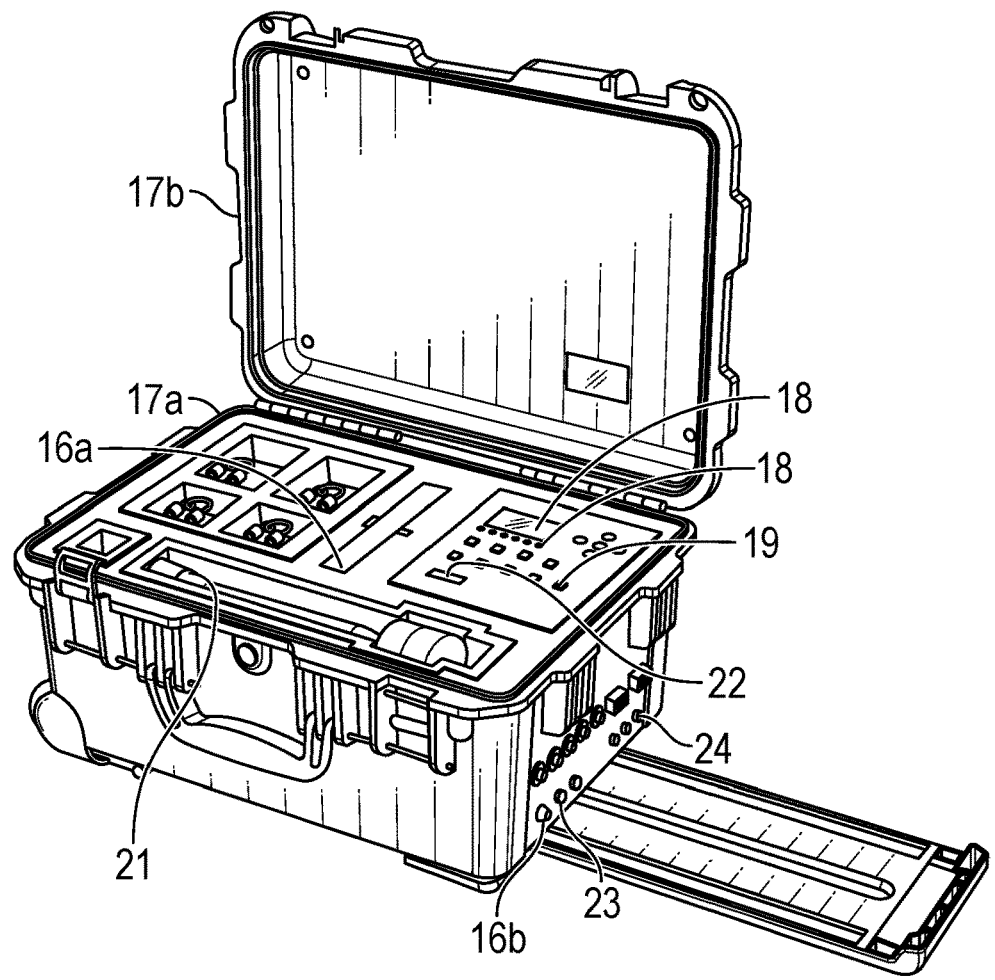
FIG. 2 is a perspective view of a typical data acquisition unit.

A typical data acquisition unit is shown in FIG. 2. The unit is a rugged, lightweight, portable, battery powered, dynamic measurement system that is fully integrated with satellite positioning technology for unparalleled performance and accuracy. It can be both a dynamic data measurement unit and recorder providing high grade acoustic and vibration measurement and data recording, as well as a real-time dynamic signal analyzer providing real-time processing in the field.

A data acquisition unit is typically equipped with 4 input channels. For example, each analog input may be serviced by two 24-bit ADCs and a DSP implementing the patented technology of U.S. Pat. No. 7,302,354 to achieve better than 150 dBFS dynamic range. Measured time histories can be stored in 32-bit single precision floating point format (per IEEE 754-2008) and all subsequent signal processing is performed using floating-point arithmetic. A choice of sample rates from 0.48 Hz to 102.4 kHz may be provided with better than 110 dB of alias-free data from DC to 45% of any selected sample rate protected by steep 160 dB/Octave anti-aliasing filters. Input mode can be set to either AC or DC. IEPE sensor interface can support up to 28 V/10 mA source range. Transducer Electronic Data Sheet (TEDS), standardized in IEEE 1451.4, provides one convenient way to manage the sensor library using a template that identifies and characterizes the analog sensor and its data signals (transducer type, calibration profile, data type and format, etc.).

The data acquisition unit may accurately measure and record both dynamic and static signals, simultaneously recording 4 channels of data at up to 102.4 kHz while performing real-time frequency and time domain calculations. An embedded signal source channel can provide several standard waveforms that are synchronized with the input sampling rate.

Multiple continuous data streams and processed block data can be saved to a plug-in SD memory card 22. The incoming data first goes through data conditioning phases such as calibration (gain and offset adjustment) and high/low-pass filter. All input data will be updated continuously with a large circular buffer in RAM. This circular buffer supports pre-trigger recording, i.e., recording a period of data before the trigger event.

The recording can be initiated from many trigger sources.

In a typical sampling rate of 64 kHz, as long as 120 seconds of pre-trigger duration can be configured for all four input channels, the duration of post trigger can be as long as hours or days. The signals of both pre- and post-trigger duration will be stored into a secure memory card 22 without disruption. All data stored to the external memory card 22 can be set to be encrypted using a cryptographic module implementing an approved encryption algorithm, such as in accord with the U.S. Federal Information Processing Standard Publication 140-2 (FIPS PUB 140-2).

With a built-in GPS (Global Position System) receiver, accurate time and location information is always known. Antenna ports 24 for GPS, cellular telephony, ADS-B aircraft signals, etc. are provided. Recording data can be time stamped at the ADC sampling clock level. High precision time stamping is implemented at the unit's hardware layer. This approach will eliminate the time latency and variance caused by software operation. The time stamps signals are stored during the same period when measurement recording signals are taken. Post-processing software is provided to display and process those time stamped signals which ensures the accuracy of time stamps as 10 µs, or better.

An Automatic Dependent Surveillance-Broadcast (ADS-B) interface allows the data acquisition unit to receive aircraft flight information from multiple aircrafts within a one-hundred-mile range. The unit's processor can decode text messages embedded in the ADS-B message train and trigger certain actions such as measurement and recording at each data acquisition unit.

Two types of satellite communication modules can be integrated into the data acquisition unit, a module that transmits the low bandwidth text information both ways, or a module that transmits the high bandwidth signals both ways. The low bandwidth option allows the user to remotely view certain status from the data acquisition units and broadcast messages to all of a system's data acquisition units, while the high bandwidth option allows the remote host to view the live real-time signals being acquired on each unit.

When a broadband cellular communications network is available, the user can choose to use 4G LTE, 4G or 5G technology. A slot and interface 24 are provided on the data acquisition unit to integrate a cellular module. The data acquisition unit can then communicate with the host computer through a wireless cellular network.

A dedicated battery-powered Real-Time Clock (RTC) circuitry is designed so the system can be recovered from failures, such as hardware failure caused by intermittent mechanical shock, over-heat, over-cold, or if the main battery runs out. Using RTC and its counter, the system can try to wake itself up at a preset period. The RTC battery is independent to the main power battery 16a, and it has a lifespan of roughly 10 years.

A signal source is available to output typical waveforms such as continuous sine, random, white noise, pink noise etc. The signal source is also split to drive an external audio speaker, which is for the end-to-end test that is used to check the integrity of the whole system.

There are six digital input channels 23 inside of the enclosure and one outside. All can be used to generate various software events such starting or stopping the recording.

The data acquisition unit has an LCD display 18 as well as a physical keypad 19 to enter various user-selected settings.

The data acquisition unit's enclosure 17a is ruggedized and made weatherproof to protect the unit and other accessories during extreme weather and severe environmental conditions where the unit needs to be deployed. To further protect from extreme environment and heavy rainfall, the enclosure 17a is designed to sustain high winds and heavy rain. Ethernet port 23, Secure Digital (SD) memory card interface 22, audio output, and antenna connectors 24 are all present on the exterior of the enclosure 17a. As for the degree of enclosure protection against solid particle and liquid ingress (IEC 60529), all connectors are rated IP67 (dust tight and protection against immersion up to 1 m depth). The LEMO connectors ensure stability during high winds or harsh environments in addition to dust and water protection. The enclosure structure 17a is built using a combination of metal, plastic, and Pelican™ materials. Keypad 19 and all other buttons including the SD memory card 22 are placed inside a lockable enclosure to secure the operations and data. The data acquisition unit has no cooling fan mounted on the enclosure. It is extremely quiet during the operation.

Antenna connections 24 for ADS-B, Cellular, Satellite and GPS receivers are available outside the enclosure to facilitate external connections.

The data acquisition unit's enclosure has external interfaces 21 to connect up to 4 microphones or other types of sensors. In addition, secure ports are available to connect the signal source, trigger switch and a port for general purpose digital inputs 23 is available external to the enclosure. A typical enclosure dimension is 21.5 in×14 in×8.3 in, which is sufficient to include all the necessary components to operate.

When the Pelican™ case cover 17b is closed, the user will be able to see the internal LCD and LED display 18 through a small transparent window. Connectors 24 are located on the side.

An external interface 16b to connect external DC power to the enclosure 17a either from a dedicated AC power through an AC-DC adapter or from a power generating solar panel is available.

The unit is typically operational over a temperature range of from −20° C. (−4° F.) to 55° C. (131° F.). It can be powered ON and be fully operational after cold soaking for 24 hours or longer at 0° F.

Without considering the optional external solar panel that can be coupled to port 16b, the weight of the data acquisition unit's enclosure including all accessories is estimated to be under 32 lbs.

The data acquisition unit can conduct comprehensive system checks before any measurement is taken, including:
 Processor system check and internal hardware resource check
 IEPE sensor loss check, if the sensors are an Integrated Electronics Piezo-Electric (IEPE) standard sensor type
 TEDS sensor check, if the sensors are a Transducer Electronic Data Sheet (TEDS) standard sensor type
 Internal end-to-end spectrum measurement check
 SD Card, GPS, ADS-B, memory checking
Among these options, the end-to-end spectrum measurement check is the most effective method to check the complete system health.

The data acquisition unit's design is based on a portable signal analyzer platform which includes data recording and many real-time signal analysis functions, including: FFT, frequency response, swept sine, transient capture, waterfall, real-time digital filters, octave filters, sound level meter, shock response spectrum analysis, sound power analysis and limiting test. A dozen typical output signal types can be fed to the output terminal as the signal source. These functions are optionally available and enabled through license keys.

Data Acquisition Flow

Figure 3:
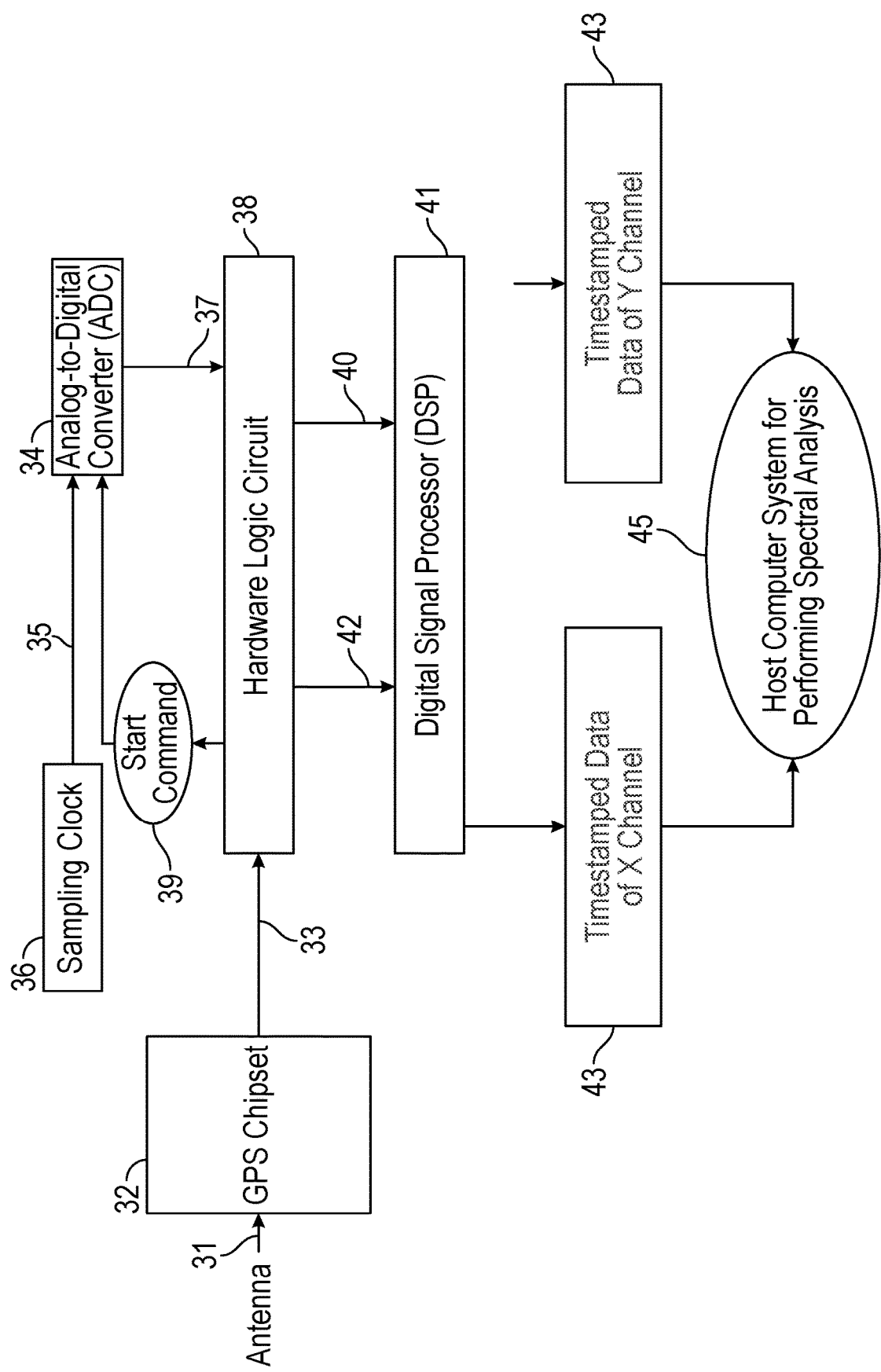
FIG. 3 is a partial block diagram of data acquisition units (one entire unit is shown, while the other is identical but has its own sampling clock) providing independent X and Y channels of timestamped measurement data for spectral analysis.

The general data flow in a data acquisition unit is shown in FIG. 3. This results in time stamped measurement data based on a GPS time base. As seen in FIG. 3, a basic embodiment of a synchronization circuit for a data acquisition unit has a satellite radio beacon positioning system receiver with a time register, such as an appropriate antenna 31 to receive the satellite messages, a GPS chipset 32 for processing those messages to derive a position and an absolute time maintained in the chipset's time register, and a time register output 33 providing the absolute time value to the rest of the circuit. One example of a GPS chipset 32 that may be used is any of the LEA-6 high-performance stand-alone GPS receiver modules supplied by u-blox AG of Thalwil, canton of Zürich, Switzerland. The GPS timing accuracy under good signal conditions is better than 60 ns with 99% probability according to the specifications of this chipset. GALILEO and GLONASS capable receivers are also available in this chip series. Similar receiver modules from other manufacturers might also be used.

An analog-to-digital converter (ADC) 34 handles the incoming measurement data. An ADC requires a clock 36 with a specific oscillator frequency to drive its sampling. These might include 16.384 MHz, 20.97152 MHz, and 26.2144 MHz, which are configured to match specific sampling frequencies, such as 102.4 kHz or 81.92 kHz. The clock 36 outputs its oscillator signal 35 to drive the data sampling by the ADC 34, which in turn outputs the sampled measurement data 37 in digital form.

A hardware logic circuit 38, which is typically in the form of a field programmable gate array (FPGA), receives the sampled data 37 on one of its inputs and the absolute time value (e.g., UTC) from the time register output 33 of the positioning system receiver chipset 32 on another of its inputs, applies a timestamp to the sampled measurement data and outputs that timestamped data 40, for example to a digital signal processor (DSP) 41 for analysis. The FPGA logic circuit 38 will also manage the initial starting time of ADC conversion via a starting command 39 to the ADC 34.

Specifically, for hardware timestamping operation, the data 40 is sent to the DSP 41 in buffers, where the DSP reads the absolute UTC time from the applied timestamp 42 in a data frame of that received data. Unlike a processor that may encounter many timing errors and latency, an FPGA or other hardware logic circuit 38 conducts tasks with absolute consistency. All its operations are operated at the nanoseconds level with precision timing. By the time the DSP 41 reads the live data, the data already been timestamped by the hardware logic circuit 38.

One way the hardware logic circuit or FPGA 38 can apply the time stamp is using a data buffer and a hardware interrupt to the GPS receiver circuit 32. An antenna 31 receives the satellite signals and the GPS receiver 32 decodes them into timing information. The receiver 32 can also receive an external interrupt from the FPGA 38 and save the current time mark in a register at the instant when it receives the interrupt. After this time mark is obtained, the receiver 32 can transmit the value of this time mark 33 through a serial UART port.

After the ADC 34 starts sampling measurement data 37, that data will come into a data buffer in the FPGA 38, where the buffer has a length that can store L measurement points. The reason to have a buffer is that we don't want the DSP 41 reading it too frequently. Instead, after the buffer's last point is filled, the FPGA 38 will send a hardware interrupt to the GPS receiver 32. Within less than 1 μs, the GPS receiver 32 will pass the current time mark 33 to its register. After that process is finished, the FPGA will inform the DSP 41 by sending an interrupt. The DSP 41 will read the data 40 in the FPGA's buffer and the time mark 42 from the GSP receiver's time register output 33. It will associate the measured data by its counter since the ADC 34 reset to the time mark. Both measured data and time marks will be recorded. But the frequency of saving time marks do not need to be as frequent as measured data because we know the nominal sampling rate of the ADC's clock and any sampling clock drift is very slow.

This represents the timestamped data from one data acquisition unit, forming recorded time waveforms and time stamps of an X channel 43. Other data acquisition units will likewise record and send timestamped measurement data, such that represented by Y channel 44. A host computer system 45 receiving the two X- and Y-channel timestamped measurement data 43 and 44 can then perform cross-spectral analysis upon the received channels of measurement data.

Figure 4:
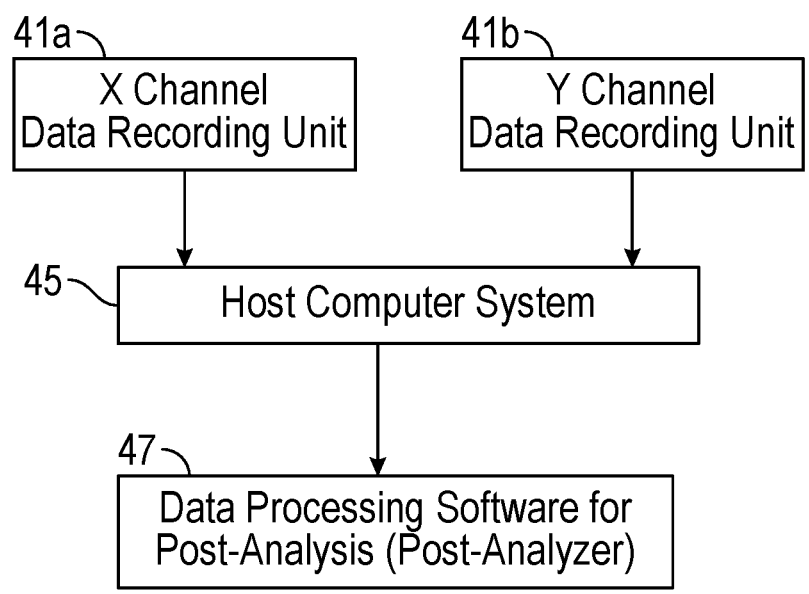
FIG. 4 is a block diagram of software components for a ground recording system analysis of measurement data.
Figure 5:
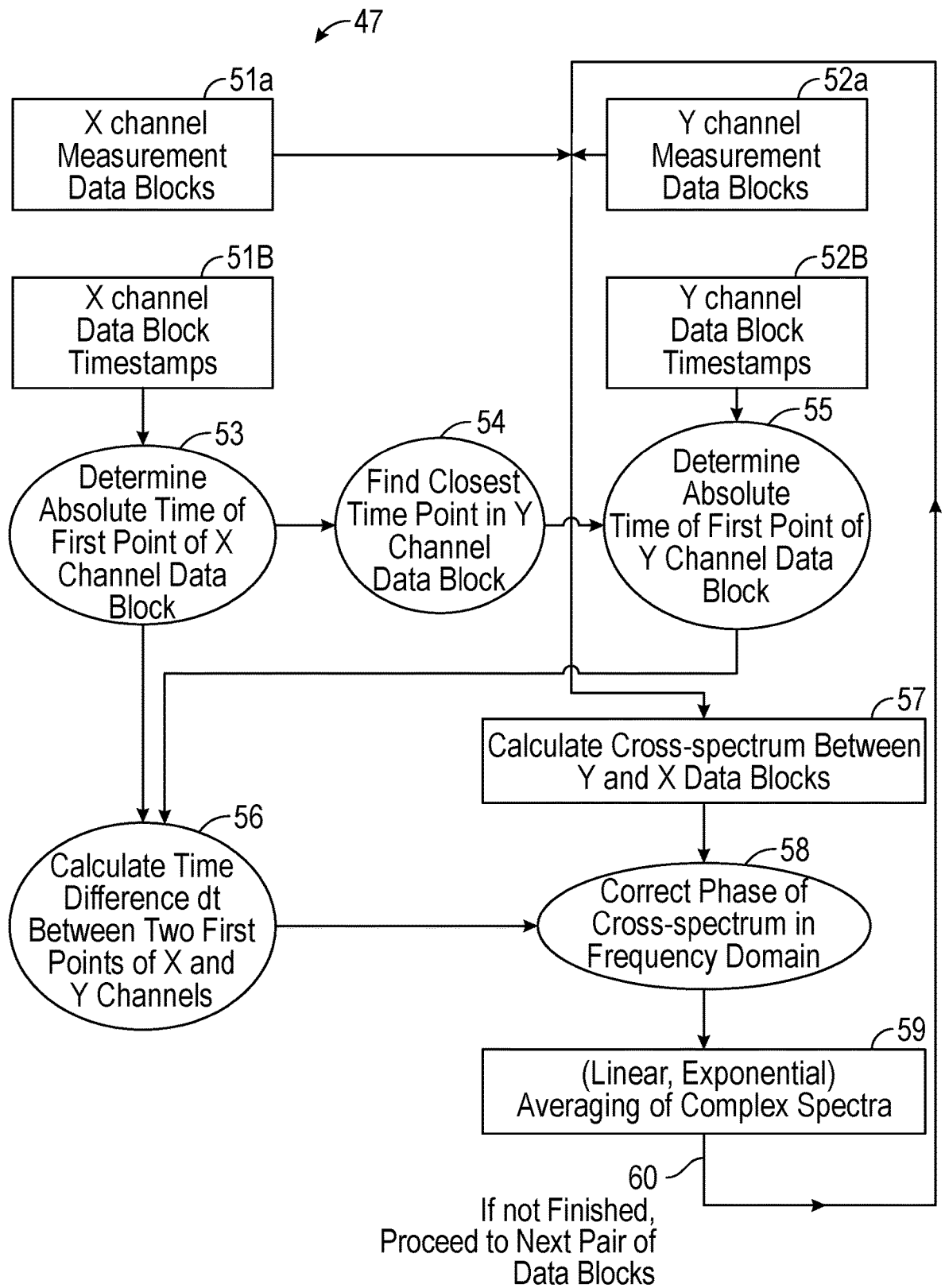
FIG. 5 is a flow diagram of a spectral analysis of time-stamped data for X and Y channels.

To run a ground recording system (GRS) and view measurement data, the user is required to have the following three software programs, organized as in FIG. 4:

1. GRS Device Firmware 41a and 41b: the embedded software operating in the data acquisition units.
2. GRS-Host 45: PC based software that can run on a laptop or remote host computer. GRS-Host can manage multiple GRS units in the field.
3. Post Analyzer (PA) 47: the data processing software for post-analysis, runs on a PC Spectral Analysis of Timestamped Data Channels The processing block 47, spectral analysis for the time stamped signals of channels X and Y, can be expanded as in FIG. 5. An interesting part of this technique is that while the non-alignment of sampling clocks in time domain is obviously caused by deviations of the ADC sampling clocks from two data acquisition units, the correction itself is not done in the time domain. Instead, it is done in the frequency domain. In fact, we believe that there is no good algorithm to correct the arbitrary time delay between X and Y channels with two separate ADC clocks. This is because the deviation between two ADC sampling clocks can be any arbitrary number.

The data processing method can be summarized in the following steps:

1. First, a user will enter measurement parameters of the data acquisition units for the X and Y data channels, such as sampling rate, block size, overlapping ratio, data window, average number, etc. These parameters are always required in a traditional dynamic signal analyzer when the same spectrum quantities are computed. Measurement data 51a from a first data acquisition unit together with corresponding timestamps 51b are received over channel X. Likewise, measurement data 52a from a second data acquisition unit together with corresponding timestamps 52b are received over channel Y.
2. For the calculation of cross spectra:
    a. The starting point of the second channel Y relative to the first channel X will be determined, which is derived for each data block in part from the entered block size and overlap ratio parameters of the data acquisition units, and from the time stamps. The absolute time is determined 53 for the first point of a block of channel X. Then, finding the closest point 54 in channel Y, the absolute time is determined 55 for the first point of a block of channel Y. From this, the system can calculate 56 the time difference between those two first points of blocks in X and Y.

b. Based on the determined relative starting point, and applying any needed data window for the analysis, the system calculates 57 the cross-spectrum between the Y and X data blocks, and a phase adjustment 58 will be made in the cross-spectrum calculation in the frequency domain. Averaging 60 may subsequently be applied to the complex spectra, then the process proceeds to the next pair of data blocks.

Calculate the Starting Point of the Block

If the digital data acquired from both channels are completely synchronized, which is the case when they are from one integrated dynamic signal analyzer, the blocks from both channels can be calculated based solely on the block size and overlap ratio.

Figure 6:
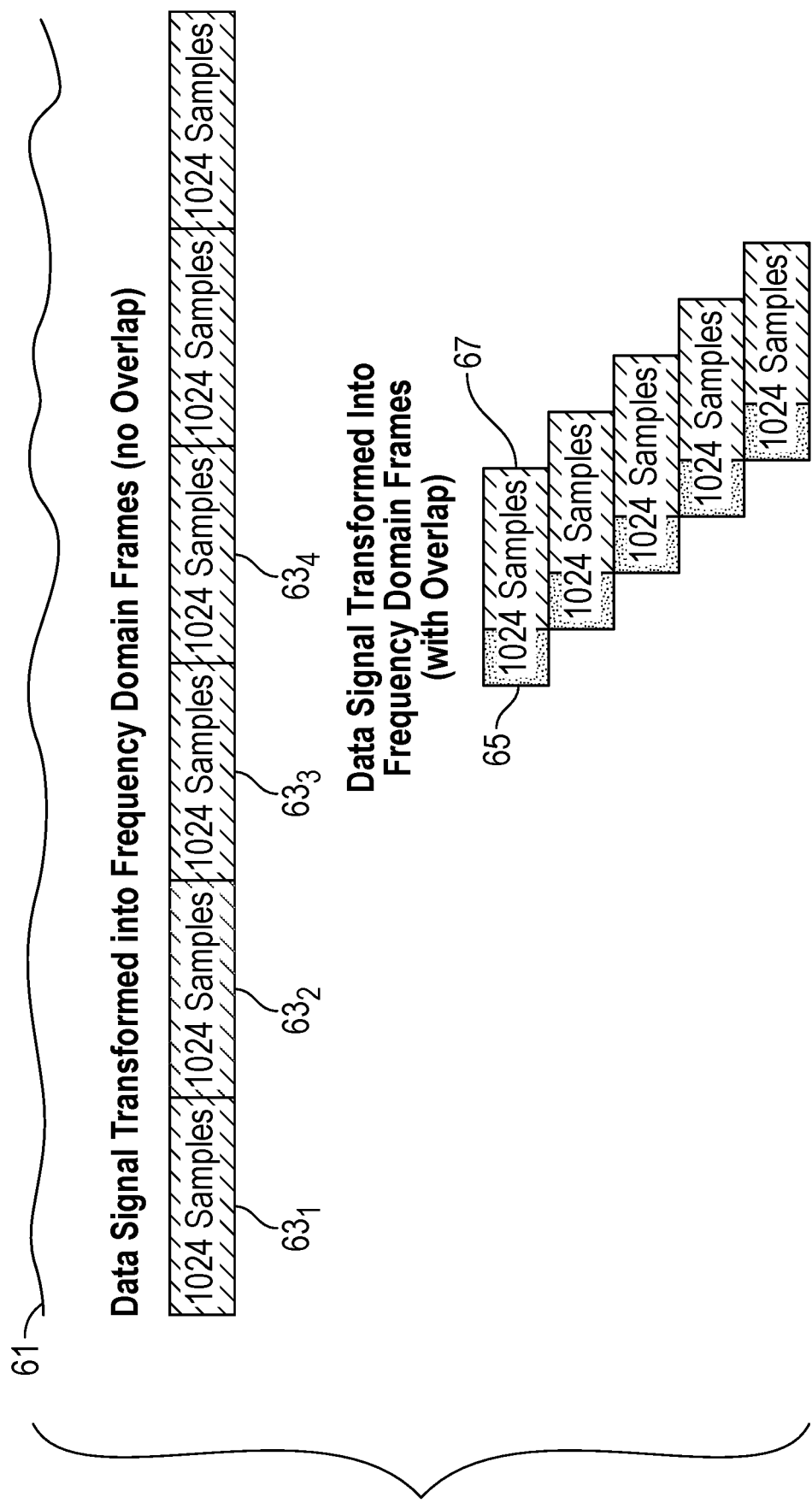
FIG. 6 is a block diagram illustration of overlap processing of acquired data.

To increase the speed of spectral calculation, overlap processing can be used. FIG. 6 shows how the overlap is realized. Signal 61 represents the sequence of sampled measurements in the time domain. This is followed by the case where the acquired signal data is transformed into FFT frames $63_1$, $63_2$, $63_3$, $63_4$, . . . of 1024 samples each, with no overlap. If instead, an overlap processing technique is employed, when a frame of new data is acquired, after passing the acquisition mode control only a portion 65 of the new data 67 will be used. The percentage of overlap is called overlap ratio. 25% overlap means only 25% of the old data will be used for each spectral processing. (0% overlap means that no old data will be reused.)

Figure 7:
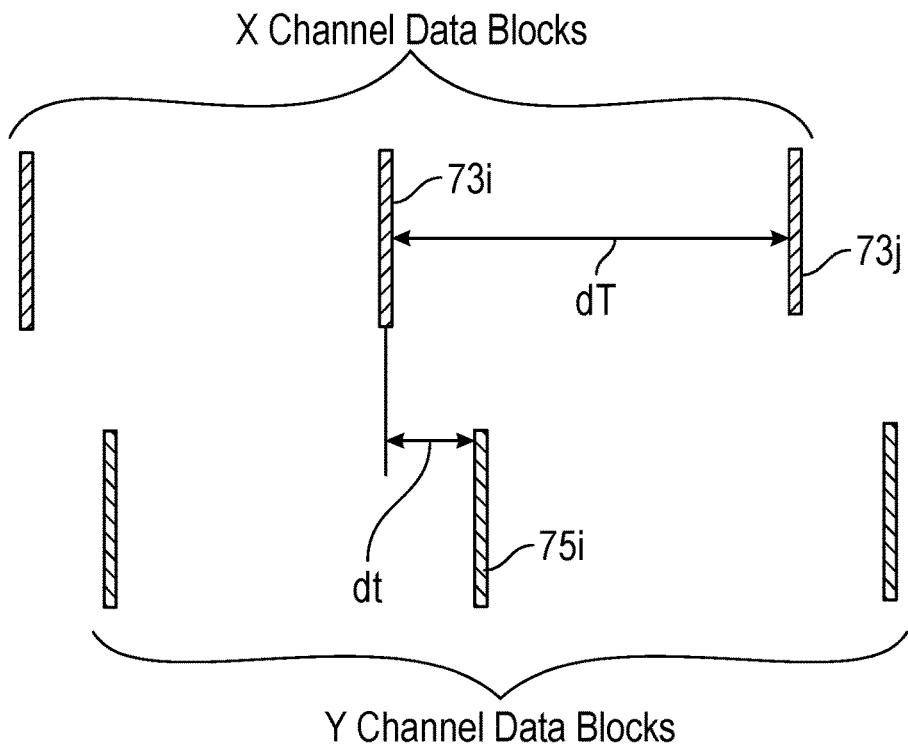
FIG. 7 is a schematic timing diagram showing starting points for two data channels.

When two signals are from different data acquisition units, because the sampling rate of two systems are slightly different (the sampling clocks in the two units operate independently of each other), there will usually be different number of sample points for the same duration of acquisition. In this case, we could not simply use the overlap ratio to calculate the starting point of the block for each channel. Instead, we must calculate the starting points of two channels with the following algorithm, as illustrated in FIG. 7:

1. Use the same algorithm based on block size and the overlapping ratio to calculate the starting point 73i of the first channel (X channel). Based on block size, the starting point 73j of the next block in the X channel will be a period dT later.
2. To calculate the starting point 75i of the block of the second channel (Y channel), using time stamps, looking for the point that is nearest to the starting point of the first input channel 73i in absolute time. Assume the time difference between these two points is dt. This can be related to the data block period dT to create a phase correction.

Now, with the starting points 73i and 75i of both channels known, we can calculate the instantaneous cross spectrum between two channels, Syx=Sx*Sy*T, using the same formula, as explained next.

Cross Spectrum Calculation

Cross spectrum or cross power spectrum density is a frequency spectrum quantity computed using two time-domain signals, usually the excitation and response of a dynamic system. Cross spectrum is not commonly used on its own. Most often it is used to compute the frequency response function (FRF), transmissibility, or cross correlation function.

To compute the instantaneous cross-power spectral density (or cross-spectral function) Syx between channel x and channel y and then the (averaged) cross-power spectral density Gyx:

Step 1, compute the Discrete Fourier Transform of input time domain signal x(k) and response signal y(k) to obtain the corresponding linear spectral functions Sx and Sy of the respective signals x and y:

$$Sx = \sum_{n=0}^{N-1} x(k)w(k)e^{-j2\pi kn/N}$$

$$Sy = \sum_{n=0}^{N-1} x(k)w(k)e^{-j2\pi kn/N}$$

Here, x(n) are the samples of the continuous time waveform and n is the running sample index. N is the total number of samples or "frame size", and k is the finite analysis frequency corresponding to FFT bin centers. The Fourier Transform assumes that the time signal is periodic and infinite in duration. When only a portion of a record is analyzed, the record must be truncated by a data window to preserve the frequency characteristics. A window can be expressed in either the time domain or in the frequency domain, although the former is more common. To reduce edge effects that could cause leakage, a window w (t) is often given a shape by use of a window weighting function g(t) such as w(t)=g(t) when −T/2<t<T/2, T being the window duration, and w(t)=0 elsewhere. A window is represented by a multiplication in the time domain and by a convolution in the frequency domain. The data analyzed x(t) are then given by x(t)=w(t)·x(t)', where x(t)' is the original data and x(t) is the data used for the spectral analysis.

Step 2, compute the instantaneous cross power spectral density:

Syx=Sx*Sy T, where "*" stands for a conjugate multiplier that is applicable to the complex values. Keep in mind that Sx, Sy and Syx are all arrays of spectral data of which each element is a complex number.

Step 3, average the M frames of Sxx to get averaged PSD Gxx and conduct the same average to the cross-spectrum density:

Gyx'=Average (Syx)

Step 4, Compute the energy correction and double the value for the single-sided spectra:

Gyx=2Gyx'/EnergyCorr

EnergyCorr is a factor for energy correction, defined as:

$$EnergyCorr = \frac{1}{N}\sum_{k=0}^{N-1} w(k)^2$$

N is the total number of the samples and w(k) is a window function.

Apply the Phase Correction to Syx[n]

Syx is called instantaneous cross spectrum because it has no average effect in it. It is an array with N pairs of complex numbers and its $n^{th}$ element is Syx[n]. After Syx is calculated, we will conduct a phase correction to the signal Syx.

Figure 8:
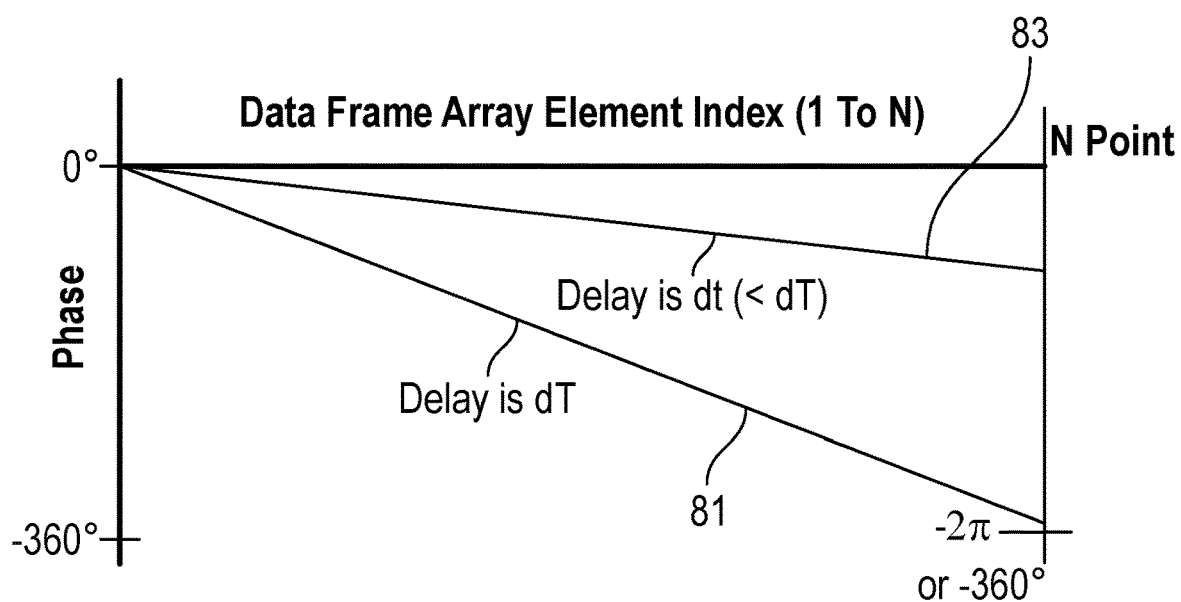
FIG. 8 is a graph of phase versus successive sample point in the frequency domain.

We know the data from two input channels have a known time delay of dt. The phase correction formula is to apply the following phase change to each element of the cross spectrum:

Phase change$[n]=2\pi*(dt/dT)*n/N$, where:
dt is the time delay between the starting point of the block of Y channel vs. X channel
dT is the nominal sampling interval. For example, for a sampling frequency of 102.4 kHz the dT is 9.765625 µs.
n is the index number of the element in the spectrum array
N is the total size of the spectrum array The formula above simply indicates that if the time delay dt is 1 sample point long dT, the phase shift between two channels will be $2n$, or 360 degrees, when frequency index is equal to the sampling frequency. FIG. 8 shows in a graph of phase versus array element index number how it can be described in the frequency domain. The lowest line 81 represents a maximum phase shift of 360 degrees, whereas the typical delay dt is usually less than that as seen in line 83.

Figure 9:
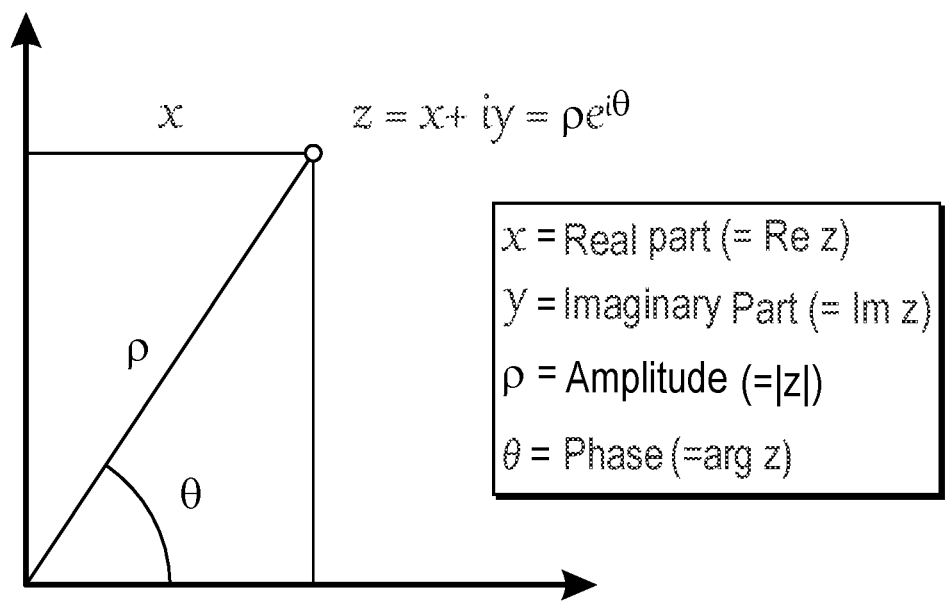
FIG. 9 is a graph of phase correction in a complex number plane.

Now, the question is how to make a phase correction to a complex number. If a complex number is expressed in an amplitude p and its phase θ, you can simply add the Phase change[n] value to the phase portion θ, as illustrated in FIG. 9, $z=\rho \cdot e^{i\theta}$. But if the complex number is expressed in real and imaginary parts, x=Re z and y=Im z, then you will have to transform them into amplitude/phase, add phase, then transform it back to real/imaginary parts.

Conduct Average and Rest of Spectral Calculation

After the phase correction is made to the instantaneous spectrum Syx, it will be averaged into Gyx, the averaged cross spectrum, using either a linear or exponential averaging algorithm. A linear average is computed by:

$$Gyx[n] = \frac{1}{M}\sum_{j=0}^{M-1} Syx[n,j]$$

where Syx[n,j] is the nth spectrum element of the cross-spectrum number j. There are totally M instantaneous cross spectra where j is the index number of the spectrum. Gyx[n] is the nth element of the averaged cross spectrum. Notice that all cross spectra are having complex values in their array.

In exponential averaging a new record is weighted more heavily than old ones, so the value at any point in an exponential average is given by:

Gyx$[n,j]=(1-\alpha)$Gyx$[n,j-1]+\alpha*$Syx$[n,j]$ where Gyx[n,j] is the nth element of jth averaged cross spectrum; Syx[n,j] is the nth element of jth instantaneous spectrum; Gyx[n,j−1] is the nth element of the previous frame cross spectrum. (Usually, a defined as 1/(Number of Averaging); for example, in the instrument, if the Number of Averaging is set to 3 and the averaging type is selected as exponential averaging, then α=1/3) An advantage of this averaging method is that it can be used indefinitely, that is, the average will not converge to some value and stay there, as is the case with linear averaging. Instead, the average will dynamically respond to the influence of new records and gradually ignore the effects of old records.

The averaging is applied only to data blocks that have valid timestamps. Any data blocks in a channel that have no valid timestamp are discarded.

There is no need to conduct the phase correction to the auto-power spectrum density because auto-power spectrum comes from the computation of one single channel.

With averaged cross-spectrum and auto-power spectra, all other spectra, Frequency Response Function (FRF) Hyx, Coherence Function Cyx, etc., can be calculated as usual.

Hyx=Gyx/Gxx

Cyx$^2$=|Gyx|$^2$/Gxx·Gyx where Gyx is the averaged cross-spectrum between channels x and y, and Gxx is the averaged auto-spectrum of channel x. The frequency response function has a complex data format that can be expressed in real and imaginary components or in magnitude and phase. The coherence function is a non-dimensional real function in the frequency domain. All spectra above have N elements, some of them are in real value, some in complex.

Typical Testing Results

Figure 10:
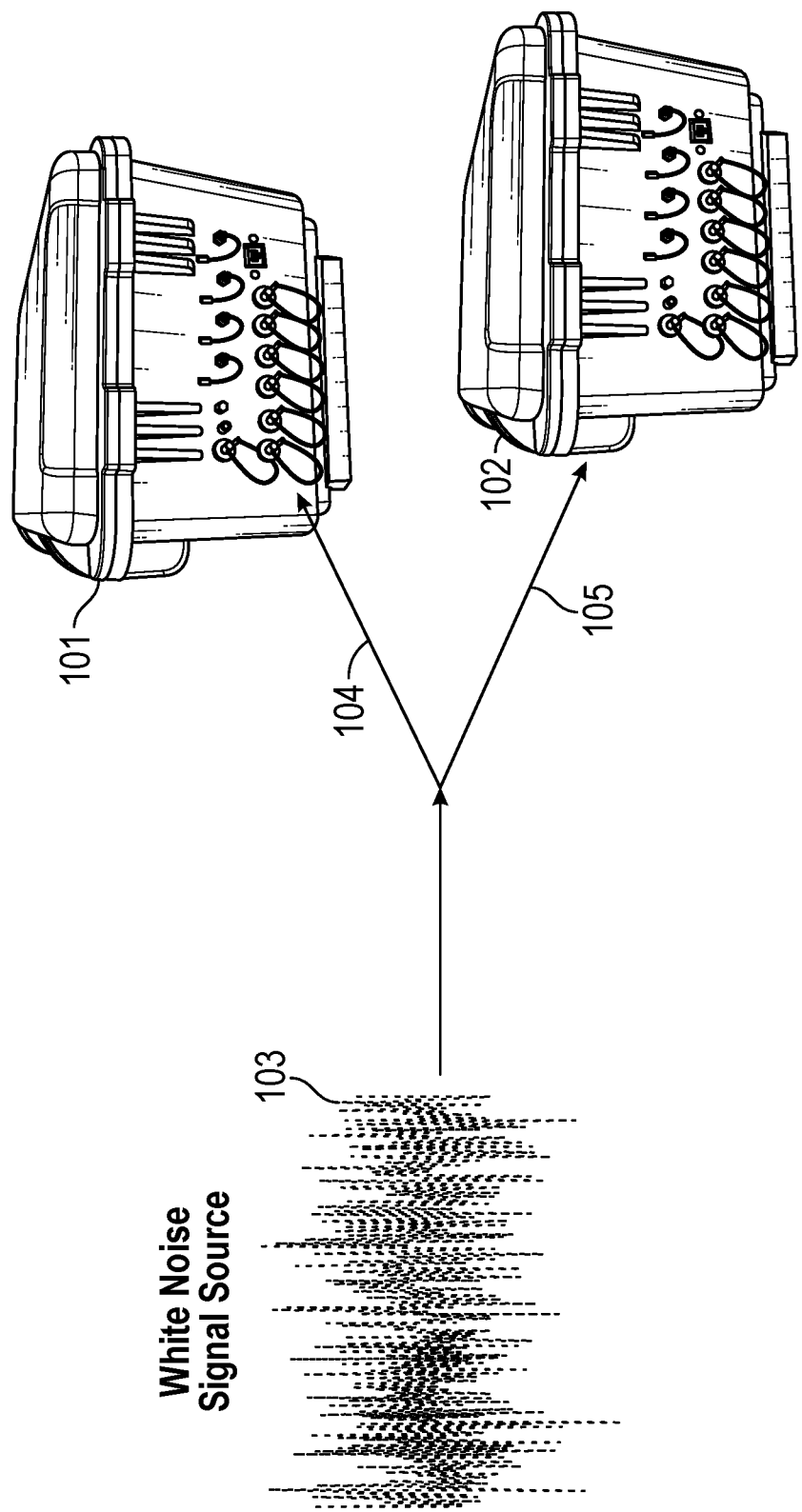
FIG. 10 is a schematic overview of a testing regime in which a white noise signal source is split and provided to two data acquisition units.

With reference to FIG. 10, to validate the effectiveness of the algorithm above, we established the following test. We took two ground recording units 101 and 102, each with GPS time stamping function installed. We fed white noise 103 into one channel 104 of ground recording unit 1 and one channel 105 of ground recording unit 2. The same white noise source 103 can be split into two using a simple BNC splitter.

We set both data acquisition units 101 and 102 with nominal sampling rate of 102.4 kHz and start to acquire the data. All measurement data can be recorded into the SD memory card. By design the total recording duration can be hundreds of hours, but we only recorded a few minutes of them for this particular test.

After the recording, we transmitted the measured data files together with their time stamp files to a PC using software called GRS-Host. The GRS-Host software can either read the data files on the SD memory card directly or read the data files from each data acquisition unit when Ethernet is connected.

After the data files are located in the PC, we open the Post Analyzer software (PA). PA can merge multiple data files into one then analyze it.

After the measured data files are merged based on time stamping information, they can be analyzed using the technique mentioned above. To demonstrate the effectiveness of this method, we set the average number to 1, which means no averaging over multiple blocks of data. If we apply averaging, then the phase measurement won't be valid.

Figure 11:
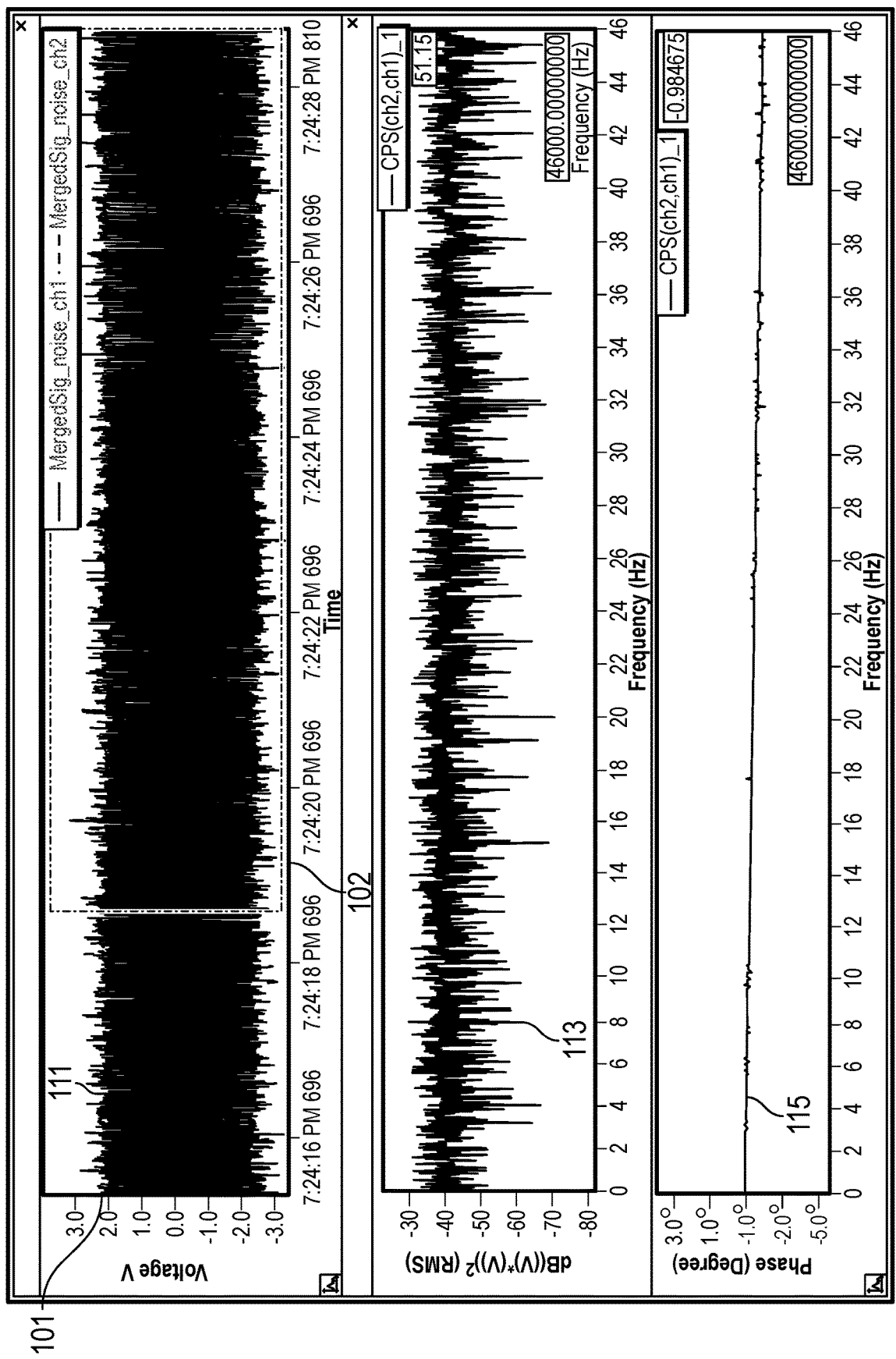
FIG. 11 is a screenshot of a test result with original time data from both units (top trace), cross-spectrum amplitude of a particular data block (middle trace), and a phase spectrum of that block (bottom trace).

The screenshot In FIG. 11 shows a typical result of the test. The top trace 111 shows the original time data from both data acquisition units. The middle trace 113 shows the amplitude of the cross-spectrum of this particular block. The bottom trace 115, which is what we really care about, shows the phase spectrum of this block from 0 Hz to 46 kHz. A cursor located at 46 kHz has a value at −0.984675 degree. This is the phase measurement at this frequency.

Figure 12:
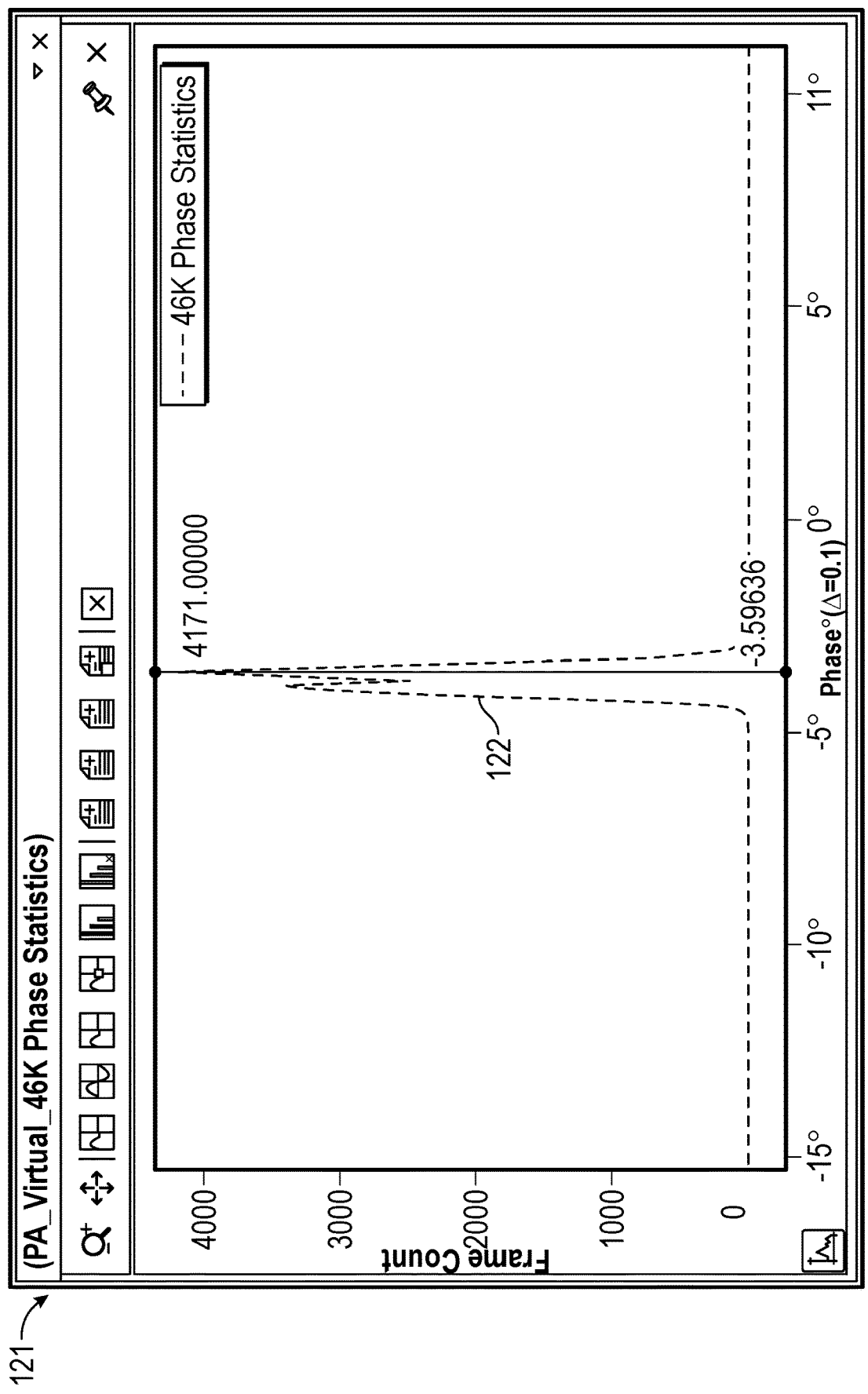
FIG. 12 is a histogram of a phase values at 46 kHz for thousands of cross-spectral test results demonstrating statistical confidence of phase matching.

To establish a statistics confidence of the phase deviation, we calculated thousands of blocks cross-spectra and stored all their phase values at 46 kHz. After these values are stored, we can draw a histogram 121 like that seen in FIG. 12.

In this histogram plot 122, the vertical axis indicates the block counts, i.e., the number of phase measurements at 46 kHz. The horizontal axis is the phase in degrees. We used multiple GRS units for testing, and they all show similar characteristics. This is how we can claim the phase measurement accuracy as below:

| Phase match between two data acquisition units: | ±5° (degree) at 40 kHz ±2.5° (degree) at 20 kHz, ±0.5° (degree) at 2 kHz. |
|---|---|

The phase value can be converted directly to the time delay of that frame between two channels. The formula is:

dT=1/46 kHz*phase/360

For example, if the phase is 5 degrees, then the time delay between two channels of that frame is:

dT=1/46 kHz*5.0/360=3e-7 (second)=300 ns

Calculating the auto-spectrum is relatively easy because it only needs to deal with the data from one single channel. Once both auto-spectra and cross-spectrum are calculated, we can compute the Frequency Response Function (FRF) and the coherence function.

What is claimed is:

1. A method for performing cross-channel spectral analysis of measurement data acquired from multiple recording units, each with their own sampling clock, comprising:
    (a) receiving first and second channels of measurement data from different recording units, each recording unit having its own sampling clock with a nominal sampling rate, the received measurement data being organized as a series of data blocks with a specified data block size, the received data having associated timestamps;
    (b) determining for each data block a degree of phase mismatch between first and second data channels;
    (c) performing a time to frequency domain transformation; and
    (d) performing a cross-spectral density calculation on data blocks in a specified time window from the two data channels and based on the determined degree of phase mismatch applying a phase correction to each data block in the frequency domain.

2. The method as in claim 1, wherein determining for each data block a degree of phase mismatch between first and second data channels comprises
    (i) determining an absolute time of a starting point of a data block of the first channel based on its associated timestamp;
    (ii) finding, by comparing timestamps associated with data blocks of the second channel, a point in a data block of the second channel nearest in absolute time to the starting point of the data block of the first channel;
    (iii) determining an absolute time of a starting point of the data block of the second channel having the nearest point;
    (iv) calculating a time difference dt between the identified starting points of the data blocks from the first and second channels; and
    (v) proceeding to a next data block of the first channel and repeating steps (i) through (iv) until all data blocks in a specified time window have been processed.

3. The method of claim 2, wherein a phase correction is based on dt/dT, wherein dT is a sampling interval between absolute times of starting points of successive data blocks of the first channel, an applied phase change for each index n in a cross spectrum with N elements is $2\pi \times (dt/dT) \times n/N$.

4. The method of claim 1, wherein, subsequent to applying a phase correction to the cross-spectrum density in step (d), obtaining an averaged cross-spectrum density by applying an averaging to multiple frames of the phase-corrected cross-spectrum density.

5. The method as in claim 4, wherein the averaging is a selected one of any of a linear and an exponential type of averaging.

6. The method as in claim 4, wherein timestamps received from each recording unit are organized in blocks of sampled measurement data, the measurement data being handled in a data buffer of a hardware logic circuit and timestamps being associated with successive blocks of buffered data through a hardware interrupt to a GPS receiver of each recording unit.

7. The method as in claim 4, wherein the averaging is applied only to data blocks that have valid timestamps, any data blocks in a channel having no valid timestamp being discarded.

8. The method as in claim 4, wherein a frequency response function Hyx is calculated from the averaged phase-corrected cross-spectrum density Gyx and an averaged auto-spectrum density Gxx of data blocks of the first data channel, where Hyx=Gyx/Gxx.

9. The method as in claim 4, wherein a coherence function Cyx is calculated from the averaged phase-corrected cross-spectrum density Gyx and an averaged auto-spectrum density Gxx of data blocks of the first data channel, where $Cyx^2=|Gyx|^2/Gxx \cdot Gyx$.

10. The method as in claim 1, wherein only a subset of sampled measurement data in each data block are used based upon an overlap ratio also specified in step (a).

11. The method as in claim 10, wherein, subsequent to applying a phase correction in step (g), further applying an averaging to multiple frames of the phase-corrected frequency domain data blocks.

12. The method as in claim 11, wherein the averaging is a selected one of any of a linear and an exponential type of averaging.

13. The method as in claim 11, wherein the averaging is applied only to data blocks that have valid timestamps, any data blocks in a channel having no valid timestamp being discarded.

14. A data processing method for correcting phase mismatch between measurement data acquired from different recording units with independent sampling clocks, comprising:
    (a) receiving first and second channels of measurement data from different recording units, each recording unit having its own sampling clock with a nominal sampling rate, the received measurement data being organized as a series of data blocks with a specified data block size, the received data having associated timestamps;
    (b) determining an absolute time of a starting point of a data block of the first channel based on its associated timestamp;
    (c) finding, by comparing timestamps associated with data blocks of the second channel, a point in a data block of the second channel nearest in absolute time to the starting point of the data block of the first channel;
    (d) determining an absolute time of a starting point of the data block of the second channel having the nearest point;
    (e) calculating a time difference dt between the identified starting points of the data blocks from the first and second channels;
    (f) proceeding to a next data block of the first channel and repeating steps (b) through (e) until all data blocks in a specified time window have been processed; and (g) performing a time-to-frequency domain transformation on the first and second channels of measurement data then applying a phase correction to each data block in the frequency domain.

15. The method as in claim 14, wherein the timestamps are derived from a series of broadcast messages received by the recording units from a satellite radio beacon positioning system.

16. The method as in claim 15 wherein timestamps are associated with blocks of sampled measurement data, the measurement data being handled in a data buffer of a hardware logic circuit and timestamps being associated with successive blocks of buffered data through a hardware interrupt to a GPS receiver of each recording unit.

17. The method as in claim 14, wherein applying a phase correction in step (g) is based on $dt/dT$, wherein $dT$ is a sampling interval between absolute times of starting points of successive data blocks of the first channel, an applied phase change for each index $n$ in a cross spectrum with $N$ elements is $2\pi \times (dt/dT) \times n/N$.

18. The method as in claim 14, wherein only a subset of sampled measurement data in each data block are used based upon an overlap ratio also specified in step (a).

\* \* \* \* \*